United States Patent [19]

Gerber et al.

[11] Patent Number: 5,495,803
[45] Date of Patent: Mar. 5, 1996

[54] METHOD OF FORMING A PHOTOMASK FOR A PRINTING PLATE WITH AN INK JET

[75] Inventors: H. Joseph Gerber, West Hartford; Russell F. Croft, Tolland; Daniel J. Sullivan, Hartford, all of Conn.

[73] Assignee: Gerber Scientific Products, Inc., Manchester, Conn.

[21] Appl. No.: 279,935

[22] Filed: Jul. 25, 1994

[51] Int. Cl.⁶ ........................................ G03F 1/00
[52] U.S. Cl. .................... 101/401.1; 101/463.1; 430/302; 430/306; 430/325
[58] Field of Search ............. 101/128.21, 128.4, 101/129, 150, 153, 158, 163, 170, 395, 401.1, 456, 463.1, 465, 466, 467; 347/2; 430/300, 302, 303, 306, 307, 308, 325–327

[56] References Cited

U.S. PATENT DOCUMENTS

| | | | |
|---|---|---|---|
| 4,003,312 | 1/1977 | Gunther | 101/466 |
| 4,981,765 | 1/1991 | Mizuguchi | 101/467 |
| 5,154,121 | 10/1992 | Schneider | 101/170 |
| 5,156,089 | 10/1992 | McCue et al. | 347/2 |
| 5,189,951 | 3/1993 | Webster et al. | 101/128.21 |
| 5,247,315 | 9/1993 | Phelan et al. | 347/2 |
| 5,260,163 | 11/1993 | Nebe et al. | 430/327 |

FOREIGN PATENT DOCUMENTS 109052  5/1988  Japan ................... 101/463.1

OTHER PUBLICATIONS

XEROX Disclosure Journal, "Waterless Lithographic Masters", vol. 1, No. 6, Jun. 1976, R. G. Crystal et al.

Primary Examiner—Stephen Funk
Attorney, Agent, or Firm—McCormick, Paulding & Huber

[57] ABSTRACT

A method and apparatus for preparing a printing plate without the need for a photomask formed from a sheet of photographic film bearing the positive or negative of the image to be printed. According to the invention, an ink jet print head deposits ink onto a light-sensitive emulsion in a pattern which corresponds to either the positive or negative of the image to be printed. The printed pattern provides a photomask for subsequent exposure of the emulsion.

1 Claim, 2 Drawing Sheets

METHOD OF FORMING A PHOTOMASK FOR A PRINTING PLATE WITH AN INK JET

BACKGROUND OF THE INVENTION

The present invention relates to the preparation of printing plates. More particularly, the invention provides a method and apparatus for preparing printing plates which do not require a photomask formed from a sheet of photographic film bearing either the positive or negative of an image to he printed.

A number of methods and apparatus are known for the preparation of printing plates. Typically, such plates are formed by placing a sheet of photographic film hearing either the positive or negative of the particular image to he printed over a substrate coated with a light-sensitive emulsion. The emulsion is then exposed using the film as a photomask. If the emulsion is of the type generally referred to by those skilled in the art as a "negative acting emulsion", the regions of the emulsion not covered by the image on the photomask are hardened and fixed to the substrate when the emulsion is exposed. If the emulsion is a so-called "positive acting emulsion", the regions of the emulsion not covered by the image on the photomask are softened during exposure, while those regions lying beneath the image on the mask remain hard and fixed to the substrate.

In either case, subsequent to exposure the soft or unhardened regions of the emulsion are washed from the substrate, leaving a pattern of hardened emulsion supported on the substrate. This pattern of hardened emulsion supported by the substrate forms the printing plate which may then used in any manner typically employed by those skilled in the art to print either the positive or negative of a desired image.

The above-described process presents a number of disadvantages. First, either the positive or negative of the image to be printed must be formed on the photographic film. Then, the film must be transferred and properly positioned on the substrate in order to expose the emulsion and form the printing plate. Such a procedure is both time consuming and labor intensive, which adds to the overall cost of the printing plate.

It is, therefore, an object of the invention to provide a method for preparing a printing plate which eliminates the need for making and positioning a photomask formed from a sheet of photographic film.

It is a further object of the invention to provide an apparatus for carrying out such a method.

SUMMARY OF THE INVENTION

The present invention meets these and other objects by providing a method for preparing a printing plate which includes the steps of providing a substrate having an unexposed light sensitive emulsion applied thereto, positioning the substrate in a printing mechanism having a printhead for dispensing ink onto the emulsion, and providing the printing mechanism with data defining a pattern to be printed on the emulsion. The printing mechanism is used to print the pattern on the emulsion layer according to the data provided, and the emulsion is then exposed using the printed pattern as an exposure mask. By exposing the emulsion in this manner exposed and unexposed regions of the emulsion are created without the need for a photomask formed from a sheet of photographic film hearing either a positive or negative of the desired image. Finally, the ink and either the exposed or unexposed regions of the emulsion are washed from the substrate to provide a printing plate comprising a pattern of raised areas of hardened emulsion supported by the substrate. The pattern of raised areas represents either the positive or negative of the image to be printed depending on how the finished printing plate is to he utilized.

The present invention also provides an apparatus for preparing a printing plate. The apparatus includes means defining a support surface for supporting a substrate having an unexposed light-sensitive emulsion layer applied thereto, and printing means for printing a pattern on the emulsion layer. The printing means and the support surface are movable relative to one another in X and Y printing axes, and the printing means includes at least one ink jet printhead for dispensing hot melt ink onto the layer of emulsion with a density of at least about $600^2$ dots per inch.

The apparatus further includes means for orienting the substrate with respect to the X and Y printing axes, means for inputting, sorting and processing data defining the pattern to be printed on the emulsion layer, data defining the dimensions of the substrate, and data defining selected coordinates within the dimensions of the substrate with which corresponding reference coordinates of the pattern are to register when the pattern is printed on the emulsion layer. Means for aligning a selected location on the substrate with a selected coordinate position relative to the X and Y printing axes is provided so that the data defining selected coordinates within the dimension of the substrate register with the corresponding reference coordinates of the pattern when the pattern is printed on the emulsion layer.

Finally, the apparatus includes print control means for activating the printing means and moving the printing means and the support surface relative to one another according to said data to print the pattern on said emulsion layer.

DETAILED DESCRIPTION OF THE INVENTION

Figure 1:
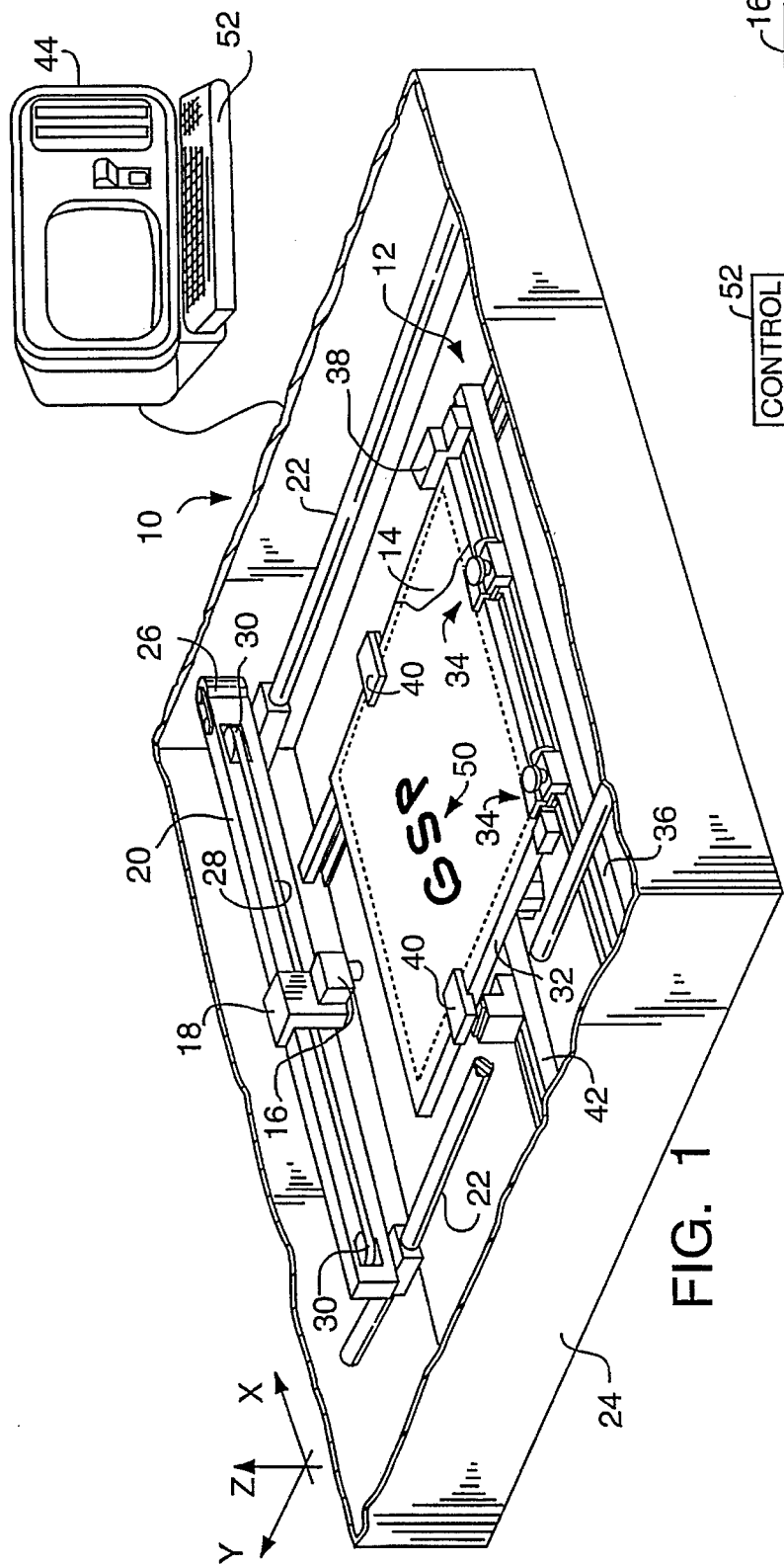
FIG. 1 is a partially schematic perspective view of a printing apparatus constructed according to the invention.

FIG. 1 illustrates a printing apparatus for preparing a printing plate according to the invention. The method for preparing the printing plate will be described in conjunction with the description of the apparatus.

The printing apparatus, generally designated 10, includes a support assembly 12 for supporting a substrate 14 positioned with respect to the illustrated X, Y and Z printing axes. A number of different substrates are known to those skilled in the art; typically, however, the substrate comprises a sheet of aluminum. The substrate 14 is coated with a light sensitive emulsion 15 which, as noted above, my be either a negative acting or positive acting emulsion. In the preferred embodiment of the invention the substrate is coated with a negative acting emulsion, and the substrate with the emulsion already applied thereto is available from 3M, St. Paul Minn., under the trade designation Viking S2 Offset Plate.

Figure 2:
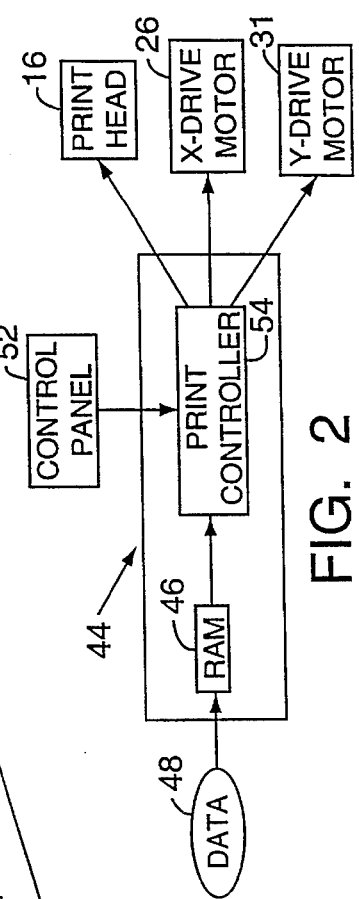
FIG. 2 is a block diagram of a control computer which forms a part of the printing apparatus illustrated in FIG. 1.

An ink jet printing head 16 is mounted above the support assembly 12 on a pen carriage 18 for movement along the X and Y printing axes. The carriage is slidably mounted on a printing carriage 20 which extends across the apparatus 10 in the direction of the X printing axis. The carriage 20 is itself slidably mounted at each end for movement in the direction of the Y printing axis on guide rails 22, 22 which are carried by the frame 24 of the apparatus 10. An X direction drive motor 26 is driveably connected to the pen carriage 18 by means of a drive belt 28 and pulleys 30, 30 to move the carriage along the X-printing axis while, in the same manner, a Y direction drive motor 31 (see FIG. 2), drive belt and pulleys (not shown) move the printing carriage 20 along the Y-printing axis.

Referring again to the support assembly 12, the construction of the assembly and the manner in which the emulsion-coated substrate is positioned with respect to the X, Y and Z printing axes are fully described in U.S. Pat. No. 5,189,951, entitled PLANAR SUPPORT FOR MATERIAL MOUNTED TO A FRAME AND METHOD OF USE. Accordingly, the disclosure of this patent is incorporated herein by reference.

Briefly, however, the assembly 12 includes a support frame 32 to which the substrate 14 is affixed. The substrate is affixed to the frame by releasable adhesive; however, any other suitable means for releasably securing the substrate to the frame without damage may be employed. After the substrate is affixed to the frame, the frame is properly positioned with respect to the X and Y-printing axes in the apparatus 10, and a selected location on the substrate is aligned with the home position of the print head 16. Positioning of the frame is accomplish by means of X-coordinate clamping assemblies 34, 34, which are slidably mounted on guide bar 36, locating block 38, and Y-coordinate clamping assemblies 40, 40, which are slidably mounted on guide bar 42. As U.S. Pat. No. 5,189,951 also fully discloses, the assembly 12 further includes means for positioning support frame 32 with respect to the Z-printing axis so that the substrate 14 is both located the optimum print distance from the print head 16 and oriented in a plane perpendicular to the Z-printing axis.

The apparatus 10 further comprises control computer 44 which includes Random Access Memory (RAM) 46 for receiving and storing data 48 which defines a particular pattern, such as the pattern 50, to be printed on the emulsion 15. The data 48 also includes data defining the dimensions of the substrate, and data defining selected coordinates within the dimensions of the substrate with which corresponding reference coordinates of the pattern are to register when the pattern 50 is printed. The control computer 44 also includes a control panel 52 through which a user may interact with the computer.

The data input in the control computer may be produced on an associated graphics generating device (not shown) such as, for example, a scanner, CAD system or other computer-based graphics generating device. Such devices are well known to those skilled in the art and will not be discussed further, except to state that in the most preferred embodiment of the invention the graphics generating device includes all of the standard graphics editing and scaling functions.

The graphics generating device may be an "on line" system communicating directly with the control computer 44, or it may be a stand alone system in which case the data 48 produced on the system is stored, for example, on a magnetic disc. In the latter case, the apparatus 10 further includes a memory storage device (not shown) for receiving and storing the data produced on the graphics generating device and for communicating that data to the computer 44.

Regardless of how the data 48 are created and input to the computer, the data stored in the RAM 46 are processed by a print controller 54 and converted into print commands. Once the substrate 14 has been affixed to the frame 24 and properly oriented with respect to the X, Y and Z printing axes by means of the support assembly 12, the print commands are transmitted by the print controller 54 to print head 16 and the X and Y drive motors 26 and 31. The print head is activated and the drive motors move the pen carriage 18 and the printing carriage 20 relative to the support assembly 12 in response to the print commands generated and transmitted by the control computer in accordance with the data. In this manner, the print head 16 is translated over the entire surface of the emulsion 15 to print the pattern 50 directly on the emulsion and to precisely and automatically position the pattern with respect to the substrate.

As noted previously, the print head 16 is an ink jet head. In particular, the print head is of the general type intended for use with a hot melt ink. The head includes a reservoir for melting the ink which, subsequent to melting, is sprayed onto the emulsion in minute droplets. The print head must be capable of precisely depositing the ink on the emulsion in accordance with the data defining the pattern and with a sufficient print density to ensure that the finished printing plate will reproduce sharp, clear images. In this connection it has been found that an ink jet head which delivers a sufficient volume of ink to provide a print density of at least about $600_2$ dots per inch produces the best results, although, depending on the particular image or printing application, lower print densities may be suitable. The particular ink jet print head which meets these requirements and employed in the preferred embodiment of the invention is available from Spectra, Inc., Hanover, N.H.

A number of hot melt inks known to those skilled in the art are suitable for practicing the invention. Generally, such inks are solid at room temperature and are liquified by heating to above about 50° C. in the print head. Inks of this type are described in U.S. Pat. No. 5,053,079, the disclosure of which is herein incorporated by reference. The inks generally include a vehicle, such as a wax, hydrocarbon polymer or $C_{14-24}$ fatty acid or ketone, dispersed pigments and viscosity and surface tension modifiers. It should be recognized, however, that the pigment dispersing agents disclosed in the above-noted patent have been found to be generally undesirable for practicing the present invention.

Non-pigmented, transparent hot melt inks are also available and may be used in practicing the present invention as described more fully below. Both hydrophilic and hydrophobic hot melt inks are also available, and the appropriate ink type is selected depending on the hydrophilic or hydrophobic nature of the emulsion, as will be readily apparent to those skilled in the art. In the preferred embodiment of the invention, the ink is hydrophobic and contains sufficient pigment density to render the ink opaque to UV radiation, the light used to expose the emulsion.

Since a negative acting emulsion is employed in the preferred embodiment, those regions of the emulsion not covered by the pattern are hardened and fixed to the substrate upon exposure. Of course, if a positive acting emulsion is used exposure will soften the regions of the emulsion lying outside the pattern. Such regions will be removed upon subsequent washing leaving a pattern of raised areas of fixed emulsion which corresponds to the printed pattern.

As noted above, the pattern may also be printed with a transparent hot melt ink. Such an ink may be utilized with either a negative or positive acting emulsion to produce the positive or negative, respectively, of the printed pattern. Accordingly, the remainder of the emulsion must be coated, such as by means of a roller, with a coating of opaque ink to protect those regions of the emulsion lying outside the printed pattern from subsequent exposure. The particular ink utilized as a protective coating is not critical, as long as it will coat the emulsion and not adhere to the hot melt ink forming the pattern. Thus, for example, as will be appreciated by those skilled in the art, if the hot melt ink forming the pattern is hydrophobic, then the ink forming the opaque coating must be hydrophilic.

In the preferred embodiment of the invention, an ink receptive coating is applied to the emulsion prior to printing to promote adhesion of the hot melt ink and provide a pattern having enhanced print density and edge sharpness. Any suitable ink receptive coating known to those skilled in the art may be used, and in the preferred embodiment the coating is a PVA polymer.

Once the pattern has been deposited on the emulsion, the emulsion is exposed using the pattern as an exposure mask. The regions of unhardened emulsion are then removed from the substrate, such as by washing, to provide a printing plate comprising the substrate and a pattern of raised areas of hardened emulsion corresponding to either the positive or negative of the image to be printed.

In most applications, the printing plate may simply be transferred to a printing press and used in a typical manner. In the case where the printing plate is to be used in an offset printing operation, the portions of the substrate not covered by the hardened emulsion must be coated with an ink repellent material such as, for example, gum arabic. This is a typical practice known to those skilled in the art which prevents ink from the press's ink fountain from adhering to the substrate.

Figure 3:
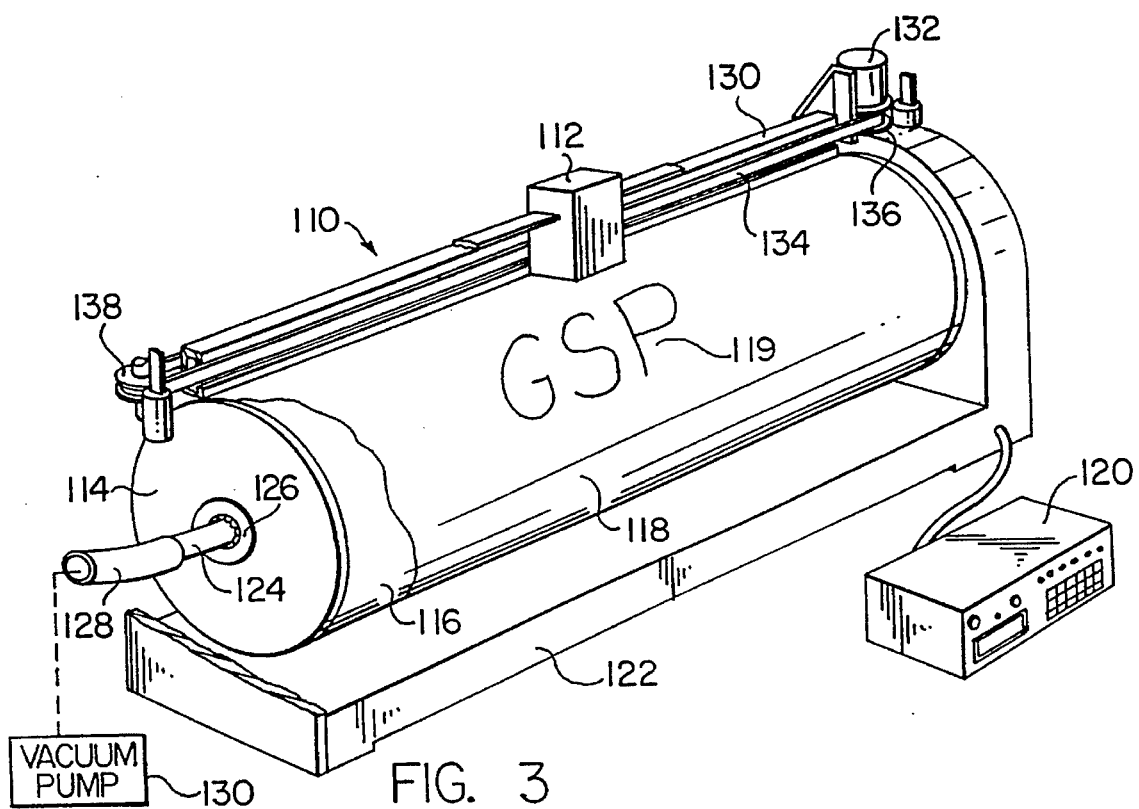
FIG. 3 is a partially schematic perspective view of a second printing apparatus constructed according to the invention.

FIG. 3 illustrates a second embodiment of a printing apparatus made according to the invention. The apparatus, generally indicated at 110, is a drum printer which includes an ink jet print head 112 of the type describe above and a drum 114. A substrate 116 coated with a light-sensitive emulsion 118 is mounted on the drum. The print head disperses ink downwardly onto the emulsion to form a pattern 119 according to data provided to a computer 120.

The drum 114 is supported on a frame 122 for rotation about a central axis of the drum. As viewed in FIG. 3, the frame 122 is broken away at the near end to expose a shaft 124 and bearings 126 which mount the drum for rotation on the shaft. The cylindrical surface of the drum may be provided with a plurality of fine apertures distributed over the region on which the substrate 116 is mounted to hold the substrate in place on the drum when a vacuum is drawn through the apertures from the inside of the drum. For this purpose, the shaft 124 extending inside the drum is hollow and connected at the near end in FIG. 3 with a vacuum hose 128 which is connected to a vacuum pump 130.

The drum 114 is rotatably driven about its central axis by means of a reversible drive motor and associated transmission (not shown). The motor receives command signals from the computer 120 and rotates the drum relative to the print head 112. The print head is mounted for movement along a support rail 130 connected to the frame 122 above the drum 114. Suitable bearings attached to the print head engage the rail 130 so that the head is accurately guided along the rail at a predetermined distance above the surface of the drum.

Another reversible drive motor 132 is mounted to the frame 122 at one end of the drum and is connected in driving engagement with the print head 112 by means of a toothed drive belt 134 and a drive pulley 136 on the motor shaft. At the opposite end of the rail 130 the drive belt is mounted on an idler pulley 138. With the print head mounted to move back and forth on the rail 130, command signals are supplied to the drive motor 132 to accurately position the print head on the rail at various positions above the substrate. It should be understood that by translating the print head on the rail and rotating the drum, the drive motors, in response to the computer 120, move the print head and the Substrate relative to one another to any given point on the emulsion. Thus, the print head deposits ink onto the emulsion to form the pattern 119 according to the data provided to the computer 120.

While preferred embodiments have been shown and described, various modifications and substitutions may be made without departing from the spirit and scope of the invention. For example, while the illustrated drum printer contemplates printing on a substrate no larger than the cylindrical surface of the drum 114, it should be understood that the invention can also be employed in drum printers having storage rolls at opposite sides of the drum for feeding long strips of emulsion-coated substrate over the drum and under the print head. Accordingly, it is to be understood that the present invention has been described by way of example and not by limitation.

We claim:

1. A method for preparing a printing plate comprising the steps of:

(a) providing a substrate having an unexposed light sensitive emulsion applied thereto; said emulsion being sensitive to UV radiation;

(b) positioning the substrate in a printing mechanism having a printhead for dispensing ink onto the emulsion, said ink being transparent to UV radiation;

(c) providing the printing mechanism with data defining a pattern to be printed on the emulsion;

(d) printing the pattern on the emulsion by means of the printing mechanism according to the data provided;

(e) coating the emulsion with a UV opaque ink which will not adhere to the printed pattern;

(f) exposing the emulsion using the printed pattern as an exposure mask to form exposed and unexposed regions of the emulsion, and (g) washing the ink and one of the exposed and unexposed regions of the emulsion from the substrate to provide a pattern of raised areas of hardened emulsion supported by the substrate, said substrate and supported pattern of raised areas forming a printing plate.

* * * * *